(12) United States Patent
Li

(10) Patent No.: US 10,573,844 B2
(45) Date of Patent: Feb. 25, 2020

(54) DISPLAY PANEL HAVING A PLURALITY OF METAL RIMS ON THE INSULATING LAYER

(71) Applicant: BOE TECHNOLOGY GROUP CO., LTD., Beijing (CN)

(72) Inventor: Yunfei Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 180 days.

(21) Appl. No.: 15/760,974

(22) PCT Filed: Sep. 14, 2017

(86) PCT No.: PCT/CN2017/101729
§ 371 (c)(1),
(2) Date: Mar. 16, 2018

(87) PCT Pub. No.: WO2018/171131
PCT Pub. Date: Sep. 27, 2018

(65) Prior Publication Data
US 2019/0214597 A1    Jul. 11, 2019

(30) Foreign Application Priority Data

Mar. 22, 2017   (CN) .......................... 2017 1 0174086

(51) Int. Cl.
*H01L 33/00*  (2010.01)
*H01L 27/14*  (2006.01)
(Continued)

(52) U.S. Cl.
CPC ...... *H01L 51/5243* (2013.01); *H01L 27/3246* (2013.01); *H01L 51/0097* (2013.01);
(Continued)

(58) Field of Classification Search
CPC ............. H01L 23/3246; H01L 51/0097; H01L 51/5246; H01L 51/56
See application file for complete search history.

(56) References Cited

U.S. PATENT DOCUMENTS

2015/0021572 A1*  1/2015  Amari ................. H01L 51/0021
                                                           257/40
2015/0091037 A1*  4/2015  Jung ..................... H01L 33/405
                                                           257/98
2016/0172623 A1   6/2016  Lee

FOREIGN PATENT DOCUMENTS

CN       1612648 A       5/2005
CN       1612650 A       5/2005
(Continued)

OTHER PUBLICATIONS

CN Office Action for CN Appl. No. 201710174086.3, dated Mar. 30, 2018.
(Continued)

*Primary Examiner* — Alonzo Chambliss
(74) *Attorney, Agent, or Firm* — Foley & Lardner LLP; James F. Ewing; Paul M. H. Pua

(57) ABSTRACT

The disclosure provides a package structure, a display panel, a display device and a manufacturing method of the package structure. The package structure comprises: an insulating layer formed on a substrate to be packaged; a metal layer formed on a surface of the insulating layer away from the substrate; and an inorganic package layer covering the metal layer and the insulating layer; wherein a portion of the insulating layer in contact with edges of the metal layer is formed with a plurality of insulating grooves arranged at intervals, the edges of the metal layer are formed with a plurality of metal rims arranged at intervals, and some or all of the metal rims are covered by the inorganic package layer.

20 Claims, 9 Drawing Sheets

(51) Int. Cl.
  *H01L 31/0232* (2014.01)
  *H01L 21/00* (2006.01)
  *H01L 51/52* (2006.01)
  *H01L 51/00* (2006.01)
  *H01L 51/56* (2006.01)
  *H01L 27/32* (2006.01)
(52) U.S. Cl.
  CPC .......... *H01L 51/5246* (2013.01); *H01L 51/56* (2013.01); *H01L 2251/5338* (2013.01)

(56) References Cited

FOREIGN PATENT DOCUMENTS

| CN | 101009956 A | 8/2007 |
| CN | 201845808 U | 5/2011 |
| CN | 103811668 A | 5/2014 |
| CN | 106025096 A | 10/2016 |
| CN | 106960914 A | 7/2017 |
| JP | 2006-004909 A | 1/2006 |
| JP | 2016-186898 A | 10/2016 |
| WO | WO-2016/150033 A1 | 9/2016 |

OTHER PUBLICATIONS

International Search Report and Written Opinion for International Appl. No. PCT/CN2017/101729, dated Dec. 13, 2017.

\* cited by examiner

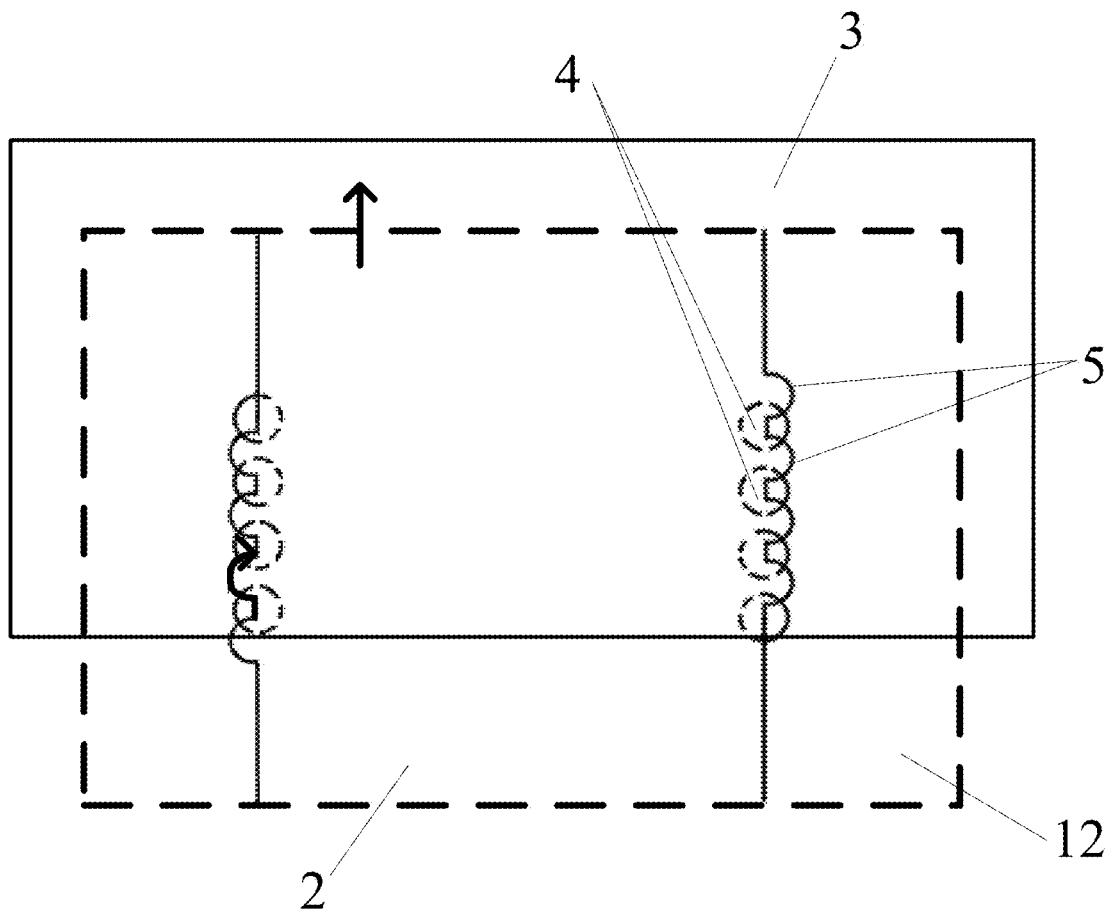

FIG. 10

| Forming an insulating layer on a substrate to be packaged, and forming a plurality of insulating grooves arranged at intervals on the insulating layer | 101 |

| Forming a metal layer on a surface of the insulating layer away from the substrate, and forming a plurality of metal rims arranged at intervals at the edges of the metal layer, wherein some or all of the metal rims are covered by an inorganic package layer | 102 |

| Forming the inorganic package layer on a surface of the metal layer away from the insulating layer, wherein the inorganic package layer covers the metal layer and the insulating layer | 103 |

FIG. 11

DISPLAY PANEL HAVING A PLURALITY OF METAL RIMS ON THE INSULATING LAYER

CROSS-REFERENCE TO RELATED APPLICATIONS

This application is a U.S. National Stage under 35 U.S.C. § 371 of PCT/CN2017/101729, filed on Sep. 14, 2017, which claims priority to Chinese Application No. 201710174086.3 filed on Mar. 22, 2017, which is hereby incorporated by reference in its entirety as a part of this application.

TECHNICAL FIELD

The present disclosure relates to a package structure, a display panel, a display device, and a manufacturing method of the package structure.

BACKGROUND

The flexible display panel is a kind of light and thin self-luminous display panel, which not only has a good display effect, but also can be bent to meet the requirements of the actual usage environment.

The flexible display panel generally comprises a flexible display substrate and a package structure layer arranged on a surface of the flexible display substrate. Specifically, the package structure comprises an insulating layer formed on the flexible display panel, a metal layer formed on a surface of the insulating layer away from the flexible display panel, and an inorganic package layer formed on a surface of the metal layer away from the insulating layer, wherein the inorganic package layer seals straight edges of the metal layer.

There is still a need for an improved package structure.

SUMMARY

In an aspect, the disclosure provides a package structure comprising an insulating layer, a metal layer and an inorganic package layer, wherein the insulating layer is formed on a substrate to be packaged, the metal layer is formed on a surface of the insulating layer away from the substrate, and the inorganic package layer covers on the metal layer and the insulating layer.

A portion of the insulating layer in contact with edges of the metal layer is formed with a plurality of insulating grooves arranged at intervals, edges of the metal layer are formed with a plurality of metal rims arranged at intervals, and some or all of the metal rims are covered by the inorganic package layer, the plurality of metal rims are arranged in the same layer as the metal layer, orthographic projections of the plurality of metal rims on the insulating layer correspond, on a one-to-one basis, to the plurality of insulating grooves, and an orthographic projection of each of the metal rims on the insulating layer partially overlaps a groove opening of a corresponding insulating groove.

In an example, the plurality of insulating grooves arranged at intervals are periodically arranged in the portion of the insulating layer in contact with edges of the metal layer. The plurality of metal rims arranged at intervals are periodically formed in the portion of edges of the metal layer that is covered by the inorganic package layer. The plurality of insulating grooves are arranged with a same periodic interval as the plurality of metal rims.

In an example, the insulating layer comprises a first insulating layer formed on the substrate to be packaged, and a second insulating layer formed on the first insulating layer, wherein the metal layer is formed on a surface of the second insulating layer away from the first insulating layer; the insulating groove is arranged on the second insulating layer, and the insulating groove runs through the second insulating layer.

In an example, a half of the orthographic projection of each of the metal rims on the insulating layer overlaps a groove opening of a corresponding insulating groove.

In an example, when the substrate is a display substrate, a depth of the corresponding insulating groove is greater than twice of a thickness of the metal layer and is less than a pixel size.

In an example, when the substrate is a display substrate, the contour of each of the metal rims is an arc, and each of the metal rims has a radius greater than twice of a thickness of the metal layer and less than the pixel size.

In an example, the shape of the groove opening of the insulating groove is the same as or different from the contour of the metal rim.

In an example, the contour of each of the metal rims is square, rectangle, circle, oval, parallelogram or trapezoid.

The shape of the groove opening of the corresponding insulating groove is square, rectangle, circle, oval, parallelogram or trapezoid.

In another aspect, the disclosure further provides a display panel comprising the above-mentioned package structure, wherein the insulating layer of the package structure is formed on a display substrate of the display panel.

In an example, the display substrate is a flexible OLED display substrate.

In still another aspect, the disclosure further provides a display device, comprising the above-mentioned display panel.

In yet another aspect, the disclosure further provides a method of manufacturing the above-mentioned package structure comprising: forming an insulating layer on a substrate to be packaged, and forming a plurality of insulating grooves arranged at intervals on the insulating layer; forming a metal layer on a surface of the insulating layer away from the substrate, forming a plurality of metal rims arranged at intervals at edges of the metal layer, wherein some or all of the metal rims are covered by an inorganic package layer; forming the inorganic package layer on a surface of the metal layer away from the insulating layer, wherein the inorganic package layer covers the metal layer and the insulating layer.

In an example, forming a plurality of metal rims arranged at intervals at the edges of the metal layer comprises: forming the metal layer with the plurality of metal rims arranged at intervals through a once-patterning process;

Forming an inorganic package layer on a surface of the metal layer away from the insulating layer comprises: using the inorganic package layer to cover the metal layer and the insulating layer.

In an example, forming a plurality of metal rims arranged at intervals at the edges of the metal layer comprises: fabricating the plurality of metal rims, and forming the plurality of metal rims as fabricated at intervals at the edges of the metal layer.

Forming the inorganic package layer on a surface of the metal layer away from the insulating layer comprises: using the inorganic packaging layer to cover the metal layer and the insulating layer.

In an example, the insulating layer comprises a first insulating layer and a second insulating layer, and the step of forming the insulating layer on the substrate to be packaged comprises: forming the first insulating layer on the substrate to be packaged, and forming the second insulating layer on a surface of the first insulating layer away from the metal substrate.

The step of forming the metal layer on the surface of the insulating layer away from the substrate comprises: forming the metal layer on a surface of the second insulating layer away from the first insulating layer.

The step of forming a plurality of insulating grooves arranged at intervals on the insulating layer comprises: forming the plurality of insulating grooves arranged at intervals on the second insulating layer, wherein the insulating grooves run through the second insulating layer.

BRIEF DESCRIPTION OF THE DRAWINGS

FIG. 10 is a schematic diagram showing a planar structure of another package structure provided according to an embodiment of the disclosure.

FIG. 11 is a flowchart showing a method of manufacturing the package structure provided according to an embodiment of the disclosure.

DETAILED DESCRIPTION

In order to make the objectives, features, and advantages of the present disclosure clearer and more comprehensible, the present disclosure is further described in detail in the following with reference to the accompanying drawings and the embodiments.

In the description of the present disclosure, unless otherwise stated, "a plurality of" means two or more than two; the orientation or position relations indicated by the terms "up", "down", "left", "right", "inside", "outside", and etc., are based on the orientation or position relations shown in the accompanying drawings, only for the purpose of describing the disclosure and simplifying the description, instead of indicating or implying that the structures or elements mentioned must have specific orientations and are constructed and operated in particular orientations, and thus cannot be construed as limiting the disclosure.

In the description of the present disclosure, it should be noted that, unless otherwise expressly specified and defined, the terms "installation", "connected", and "connection" should be understood in a broad sense, for example, it can be a fixed connection, a detachable connection, or an integral connection; it can be a mechanical connection, or an electrical connection; it can also be a direct connection, or an indirect connection through an intermediary medium. For those skilled in the art, the exact meanings of the above terms in the present disclosure can be understood depending on specific conditions.

The embodiments of the present disclosure are further described in detail below in combination with the drawings and the embodiments. The following embodiments are used to illustrate the disclosure, but not to limit the scope of the disclosure.

Although the conventional package structure has a certain function of package, since edges of the metal layer are straight lines, the portion of the inorganic package layer in contact with the metal layer is a linear structure, the inorganic package layer exhibits a single rule when growing at edges of the metal layer. When a gap is formed between the straight edges of the metal layer and the inorganic package layer, water and oxygen outside will readily penetrate into the display area along the straight edges of the metal layer, thereby affecting normal use of the display panel, and even resulting in invalidation of the device. Therefore, the existing package structure has a poor packaging effect with respect to the flexible display panel.

The present disclosure aims to provide a package structure, which can improve the packaging effect of the display panel, effectively block the water and oxygen outside from penetrating into the display area, and guarantee normal use of the display panel.

Figure 1:
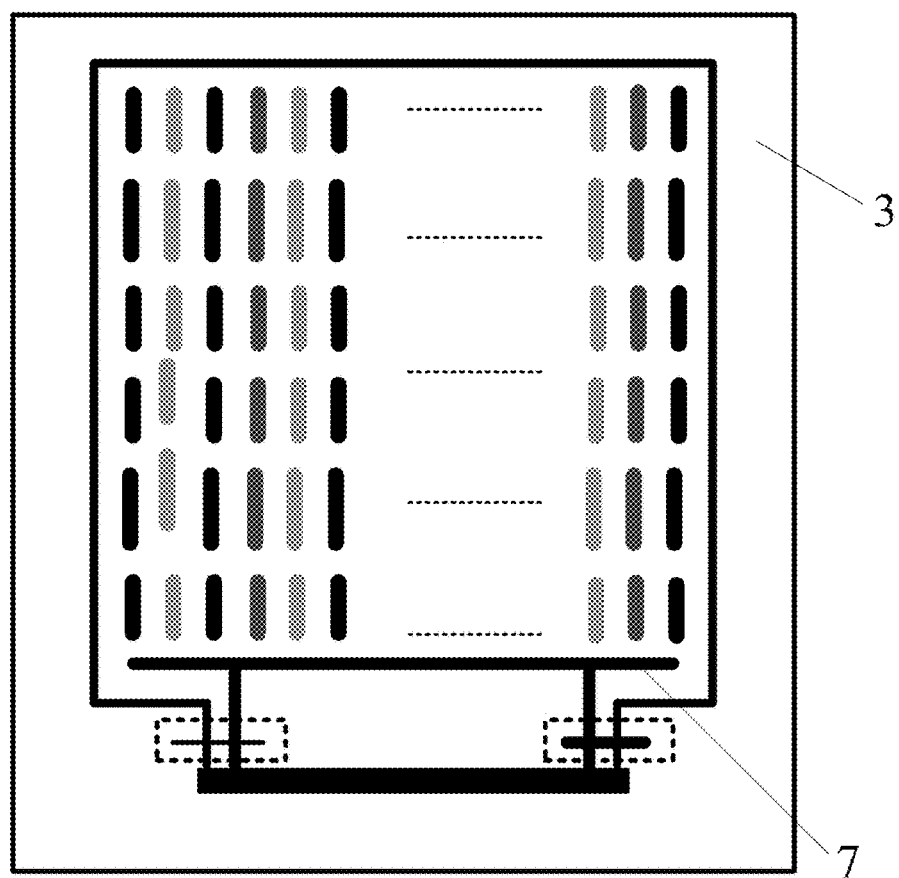
FIG. 1 is a schematic diagram showing a structure of a conventional display panel.

FIG. 1 is a schematic diagram showing a structure of a conventional display panel. The display panel shown in FIG. 1 comprises a display substrate and a package structure for packaging a light-emitting layer, the package structure being arranged on the display substrate.

Figure 2:
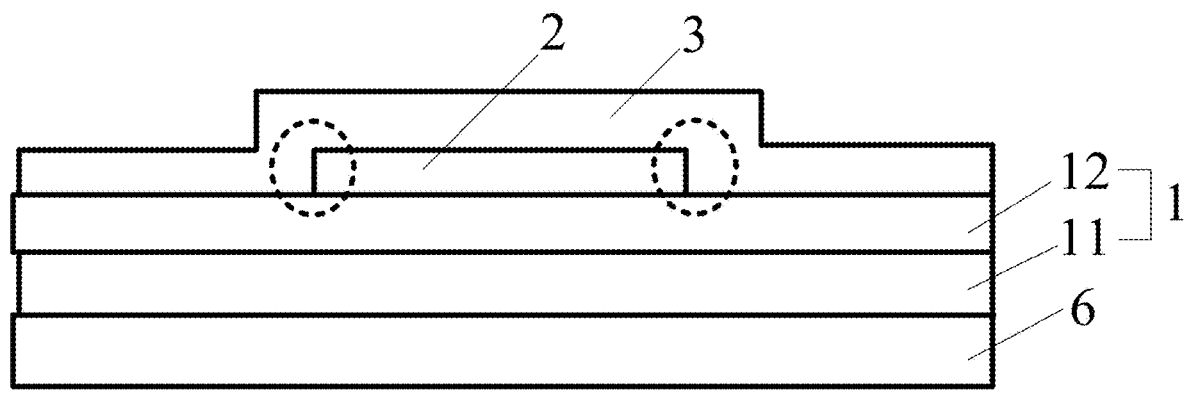
FIG. 2 is a schematic diagram showing a structure of a package structure of a conventional display panel.

In order to ensure the sealing performance of the display panel, to prevent the water and oxygen outside from intruding into the display panel, the display panel is usually packaged to form a package structure. FIG. 2 is a schematic diagram showing a structure of a package structure of a conventional display panel. The package structure shown in FIG. 2 comprises a first insulating layer 11 covering the display substrate 6, a second insulating layer 12 formed on a surface of the first insulating layer 11 away from the substrate 6, a metal layer 2 on the second insulating layer 12, and an inorganic package layer 3 laid on the metal layer 2 and the second insulating layer 12.

Figure 3:
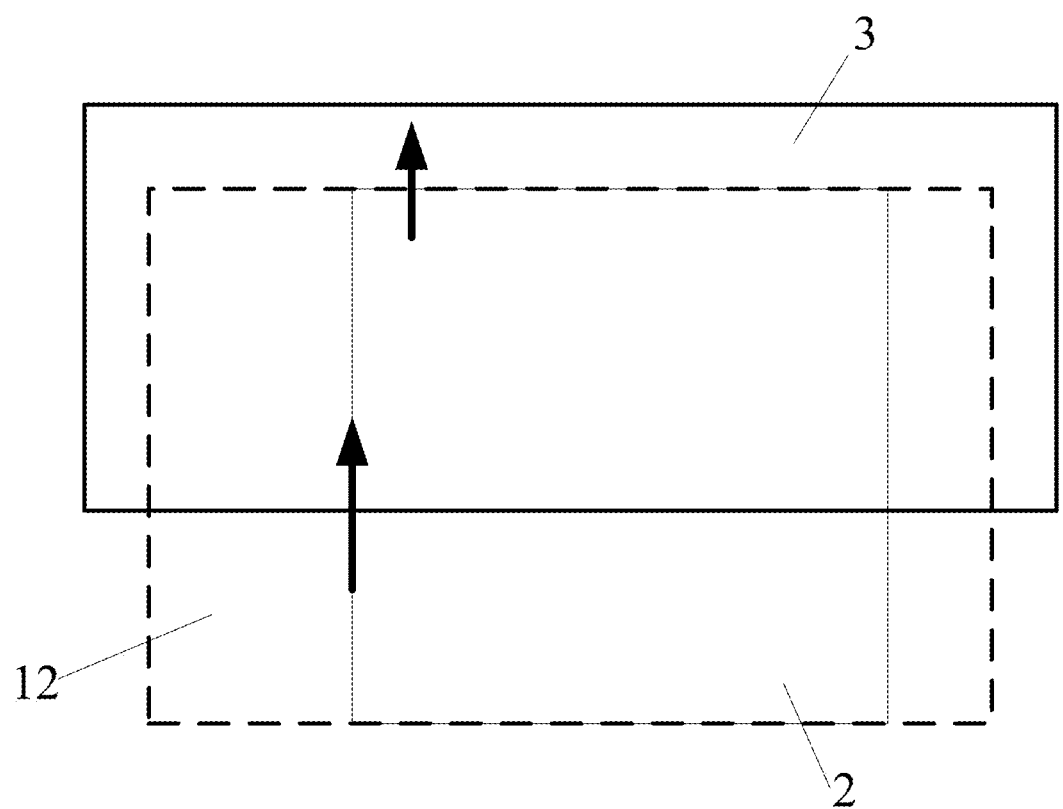
FIG. 3 is a schematic diagram showing a planar structure of a package structure of a conventional display panel.
Figure 4:
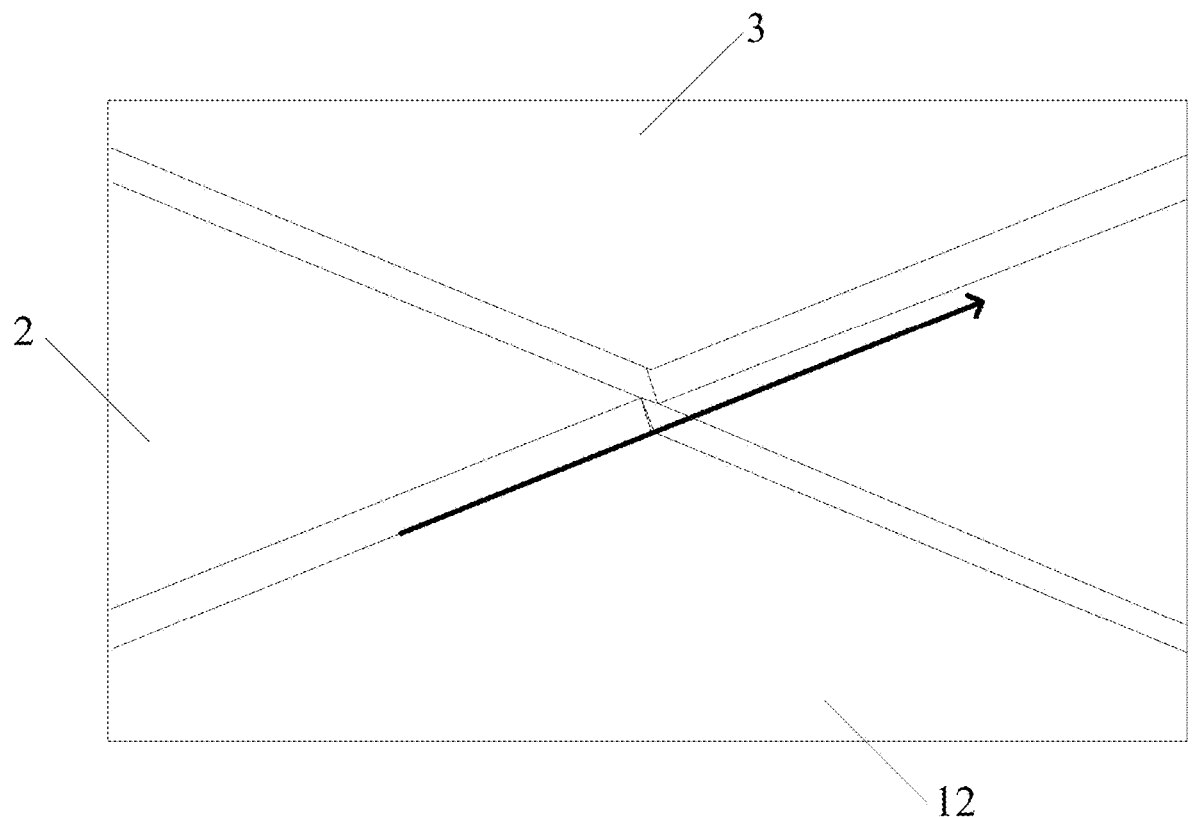
FIG. 4 is a schematic diagram showing a spatial structure of a water oxygen erosion path of a package structure of a conventional display panel.

Since the edges of the metal layer 2 in the display panel shown in FIG. 1 is a straight line structure, in the metal layer 2, for example in an area encircled by dotted lines of FIG. 1, at the positions where exposed parts of the metal wires 7 interface with the inorganic package layer 3, the growth of the inorganic package layer 3 with respect to the metal layer 2 has a poor density, therefore a water and oxygen erosion path with a straight line structure is readily formed at the interfacing positions between the metal layer 2 and the inorganic package layer 3. In FIG. 3 and FIG. 4, the direction of the arrow represents the direction of the water oxygen erosion path, i.e., the water oxygen intrusion direction, and the water and oxygen outside can easily intrude along the straight line path into the display panel, thereby affecting the display panel's normal display and reducing the service life of the display panel.

Figure 5:
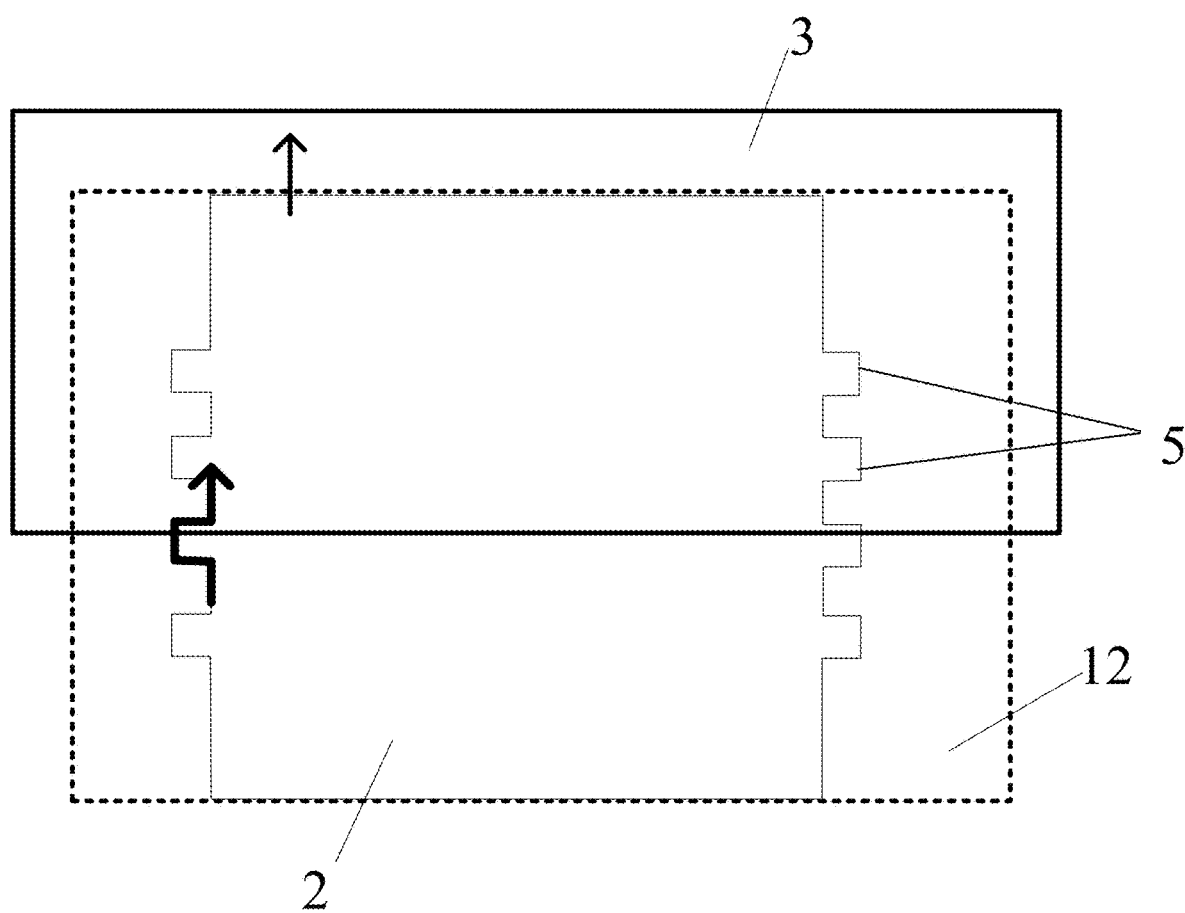
FIG. 5 is a schematic diagram showing a planar structure of a package structure of an improved display panel.
Figure 6:
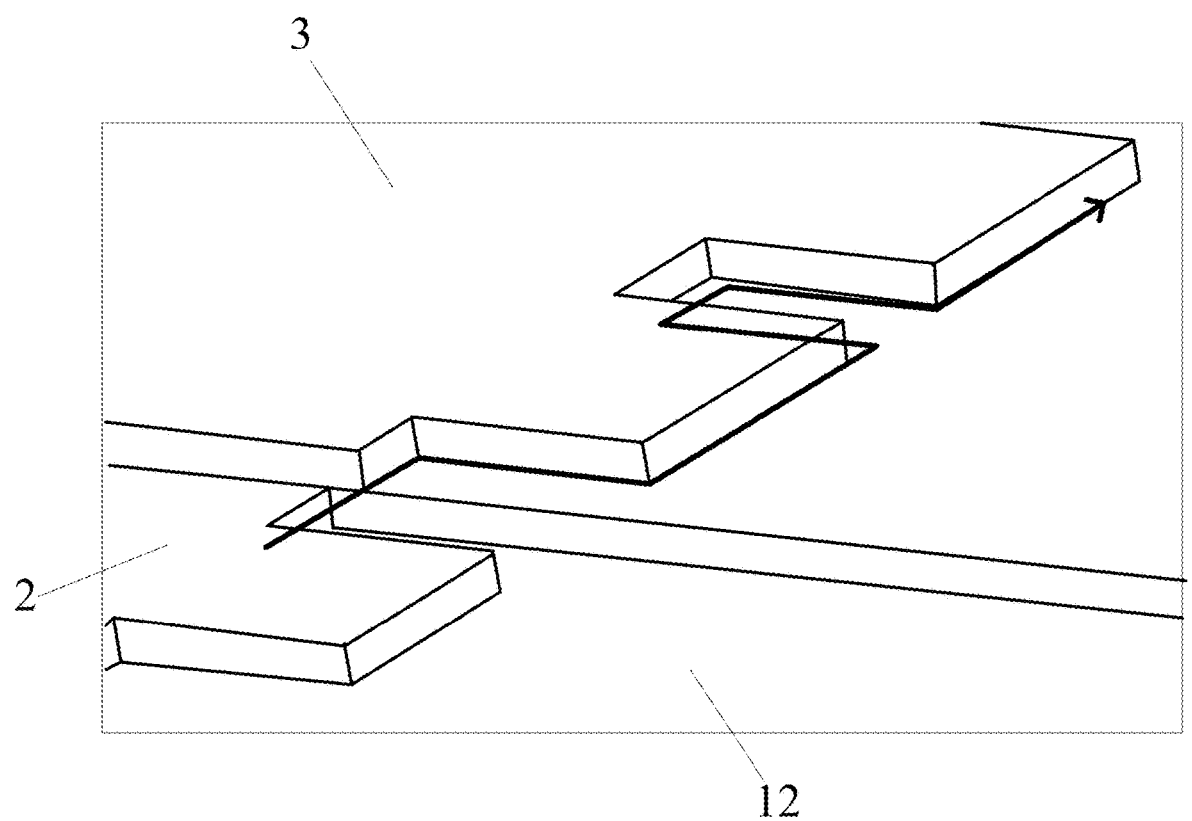
FIG. 6 is a schematic diagram showing a spatial structure of a water oxygen erosion path of a package structure of an improved display panel.

In order to improve the packaging effect of the package structure of the conventional display panel, the package structure of the display panel was improved in the prior art by making some patterns at the edges of the metal layer 2 to lengthen the water oxygen erosion path and improve the packaging effect of the display panel. FIG. 5 shows an improved package structure of the display panel. In the package structure shown in FIG. 5, the edges of the metal layer 2 are formed with a plurality of square metal rims 5. The plurality of metal rims 5 are arranged periodically, and the water oxygen erosion path formed at the interfacing positions between the metal layer 2 and the inorganic package layer 3 is a bent structure. In FIG. 6, the direction of the arrow represents the direction of the water oxygen erosion path. The water and oxygen outside intrude into the display panel along the bent path.

Although the improved package structure has a better packaging effect as compared with the package structure of the conventional display panel, since the bent water oxygen erosion path is still a planar path, the water oxygen intrusion resistance is still small. The water and oxygen can still easily intrude into the display panel along the planar path, which adversely affects the performance of the display panel.

In order to further improve the packaging effect of the package structure of the display panel, the embodiments of the disclosure have developed a novel package structure. The package structure provided according to the embodiments of the disclosure can be used to pack a display panel, and other substrates to be packaged.

Figure 7:
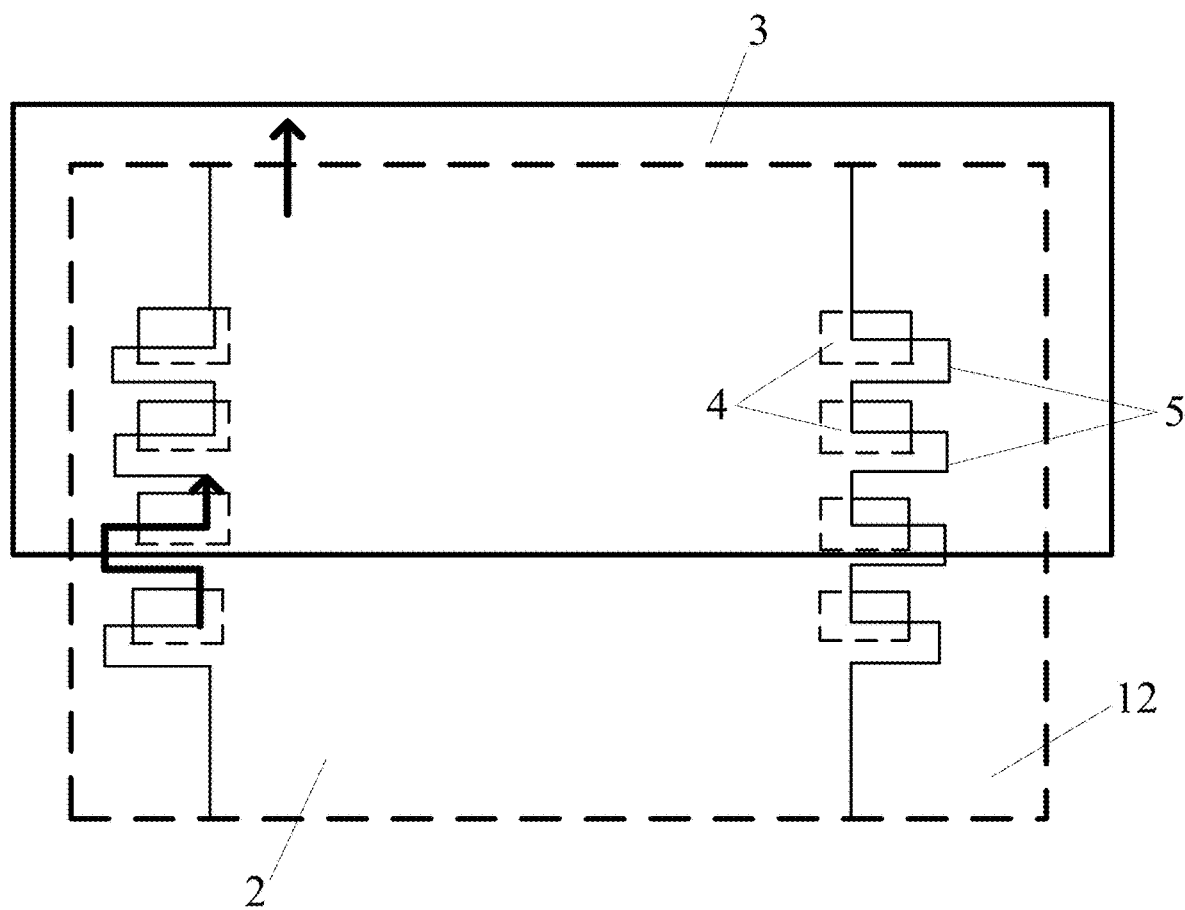
FIG. 7 is a schematic diagram showing a planar structure of a package structure provided according to an embodiment of the disclosure.
Figure 8:
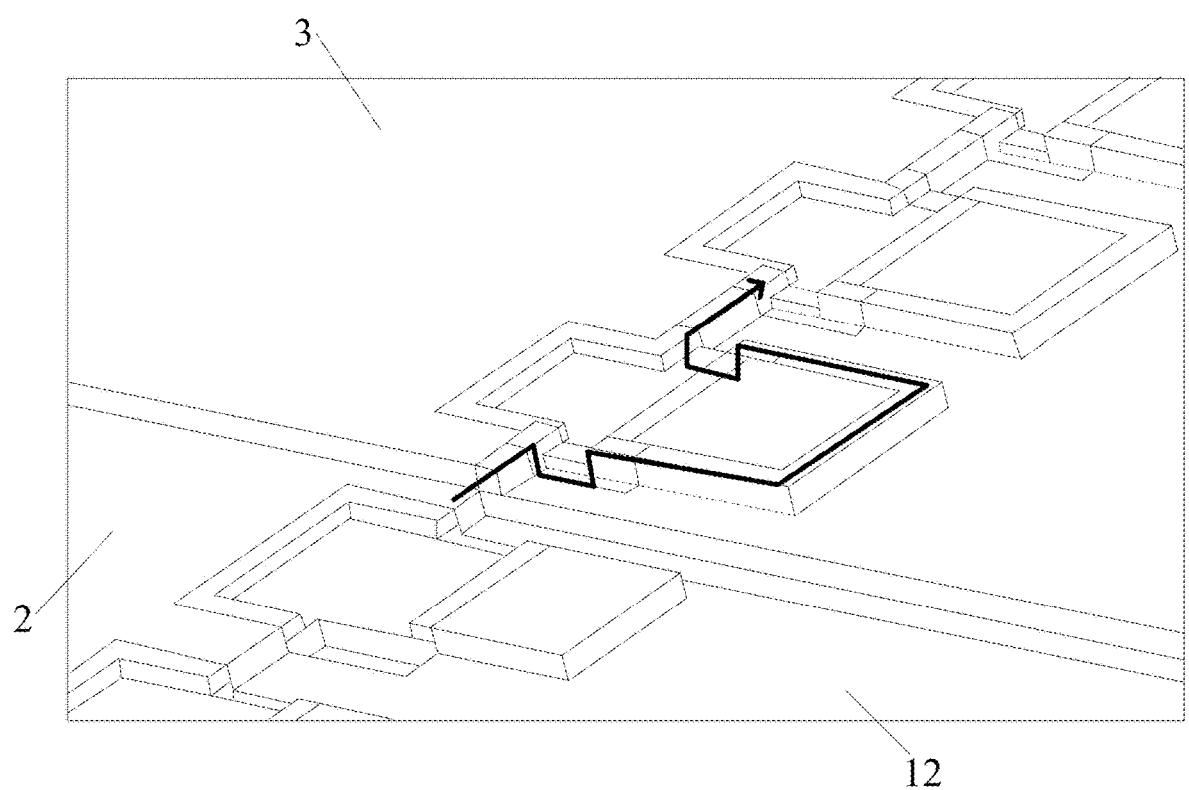
FIG. 8 is a schematic diagram showing a spatial structure of a water oxygen erosion path of a package structure provided according to an embodiment of the disclosure.

FIG. 7 is a schematic diagram showing a planar structure of a package structure provided according to an embodiment of the disclosure. FIG. 8 is a schematic diagram showing a spatial structure of the water oxygen erosion path of a package structure provided according to an embodiment of the disclosure. The direction of the arrows in FIG. 7 and FIG. 8 show the water oxygen erosion direction. By referring to FIG. 7 and FIG. 8, the package structure provided according to the embodiment of the disclosure comprises: an insulating layer 1, a metal layer 2 and an inorganic package layer 3, wherein the insulating layer 1 is formed on a substrate to be packaged, the metal layer 2 is formed on a surface of the insulating layer 1 away from the substrate, and the inorganic package layer 3 covers the metal layer 2 and the insulation layer 1. A portion of the insulating layer 1 in contact with edges of the metal layer 2 is formed with a plurality of insulating grooves 4 arranged at intervals. The edges of the metal layer 2 are formed with a plurality of metal rims 5 arranged at intervals, and some or all of the metal rims 5 are covered by the inorganic package layer 3. The plurality of metal rims 5 are arranged in the same layer as the metal layer 2, orthographic projections of the plurality of metal rims 5 on the insulating layer 1 correspond, at a one-to-one basis, to the plurality of insulating grooves 4, and an orthographic projection of each of the metal rims 5 on the insulating layer 1 partially overlaps a groove opening of a corresponding insulating groove 4.

The metal rim 5 described in the embodiment of the disclosure has a certain pattern structure, for forming a bent water oxygen erosion path. The metal rim 5 can be made of a material the same as or different from the metal layer 2, can be prepared by a once-patterning process, or can be prepared in advance and then formed at the edges of the metal layer 2. The groove opening of the insulating groove 4 is located on a surface of the insulating layer 1 away from the substrate to be packaged.

In the embodiment of the disclosure, since the metal rims 5 and the insulating grooves 4 with a certain pattern are formed at the edges of the metal layer 2 and on the insulating layer 1 below the metal layer 2, the water oxygen erosion path formed on the inorganic package layer 3 and at the edges of the metal layer 2 is not only curved in the planar direction, but also has fluctuations in the vertical direction, such that the inorganic package layer 3 exhibits diverse arrangement characteristics when growing at the edges of the metal layer 2, which breaks the single rule of the growth of the inorganic package layer 3 in the prior art. Since the structure increases the water oxygen erosion resistance while increasing the length of the erosion path, it can effectively block the intrusion of water and oxygen outside and has a better packaging effect.

In an example, the plurality of insulating grooves 4 arranged at intervals are periodically arranged in the portion of the insulating layer 1 in contact with the edges of the metal layer 2, and the plurality of metal rims 5 arranged at intervals are periodically formed in the portion of the edges of the metal layer 2 covered by the inorganic package layer. The plurality of insulating grooves 4 are arranged with a same periodic interval as the plurality of metal rims 5.

The arrangement that the plurality of insulating grooves 4 and the plurality of metal rims 5 are arranged with the same periodic interval can increase the water oxygen intrusion resistance of the edges of the metal layer 2 of a unit length in the vertical direction, and the length of the bent path, thereby further improving the packaging effect of the package structure. The embodiment of the disclosure does not limit the arrangement of the plurality of insulating grooves 4 and the plurality of metal rims 5, and other arrangements applicable to the embodiment of the disclosure are also available.

In an example, the insulating layer 1 described in the embodiment of the disclosure may be a single-layer structure, wherein the insulating groove 4 is formed on the single-layer insulating layer 1 and does not run through the insulating layer 1, and the insulating grooves 4 are insulated from the substrate to be packaged. The insulating layer 1 can also be a double-layer structure comprising a first insulating layer 11 and a second insulating layer 12, wherein the first insulating layer 11 is formed on the substrate to be packaged, the second insulating layer 12 is formed on the first insulating layer 11, the metal layer 2 is formed on a surface of the second insulating layer 12 away from the first insulating layer 11, and the insulating grooves 4 are arranged on the second insulating layer 12 and run through the second insulating layer 12.

In an example, a half of the orthographic projection of each metal rim 5 on the insulating layer overlaps the groove opening of a corresponding insulating groove 4. Based on the staggered arrangement of the metal rims 5 and the insulating grooves 4 and the overlapping of the corresponding half, the package structure has a better packaging effect, and can effectively prevent intrusion of the water and oxygen from outside.

Figure 9:
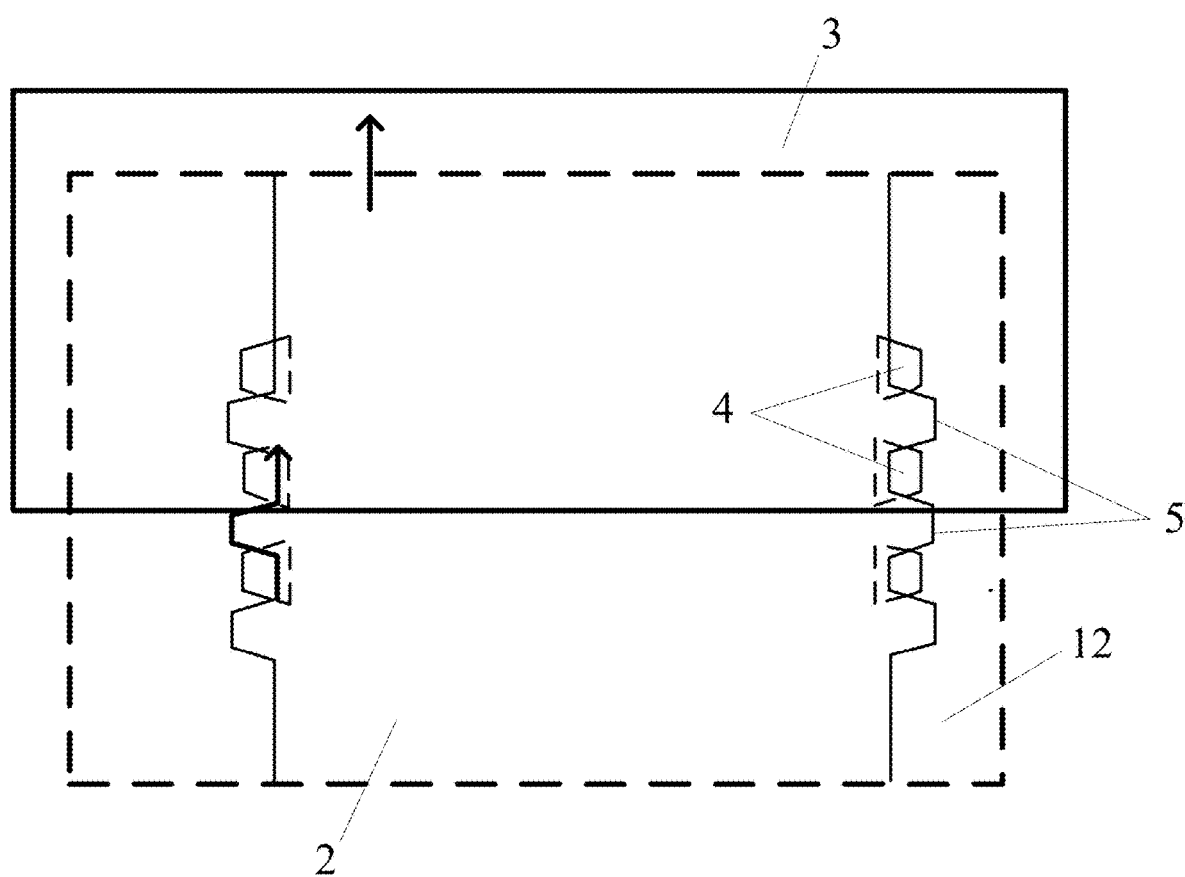
FIG. 9 is a schematic diagram showing a planar structure of another package structure provided according to an embodiment of the disclosure.

In an example, the shape of the groove opening of the insulating groove 4 can be the same as or different from the contour of the metal rim 5, which can be set according to actual needs. The contour of the metal rim 5 may be varied, e.g., square, rectangle, circle, oval, parallelogram or trapezoid. The shape of the groove opening of the insulating groove 4 may be varied, e.g., square, rectangle, circle, oval, parallelogram or trapezoid. By referring to FIG. 9 and FIG. 10, in FIG. 9, the contour of the metal rim 5 is a trapezoidal structure, and the shape of the groove opening of the insulated groove 4 is a trapezoidal structure. In FIG. 10, the contour of the metal rim 5 is a circular structure, and the shape of the groove opening of the insulating groove 4 is a circular structure.

A plenty of experimental results show that, when the depth of the insulating groove 4 is greater than twice of the thickness of the metal layer 2, the water oxygen intrusion path has a comparatively evident raised and lowered fluctuation effect, which can effectively prevent water oxygen intrusion. When the contour of the metal rim 5 is an arc and the metal rim 5 has a radius greater than twice of the thickness of the metal layer 2, the water oxygen erosion length is effectively increased.

The package structure provided according to the embodiment of the disclosure can be used to package the display panel. When packaging the display panel, in order to ensure that the metal layer 2, such as the metal wires, has a sufficient length in the course of entering the display panel, and thus has a long enough water oxygen erosion path, the depth of the insulating groove 4 is greater than twice of the thickness of the metal layer 2 and is less than a pixel size, and the arc-shaped metal rim 5 has a radius greater than twice of the thickness of the metal layer 2 and less than the pixel size. A pixel consists of a plurality of sub-pixels, and the pixel size is a side length of a rectangle of a pixel consisting of a plurality of sub-pixel pixels. For example, for a pixel consisting of three sub-pixels (red, green, and blue), the pixel size is a side length of a rectangle consisting of these sub-pixels.

The embodiment of the disclosure further provides a display panel comprising the above-mentioned package structure, wherein the insulating layer of the package structure is formed on a display substrate of the display panel for packaging the light-emitting layer of the display panel.

As the above-mentioned package structure has a better packaging effect and can effectively prevent water oxygen intrusion, the packaged display panel has a better packaging effect, and the water and oxygen outside cannot easily enter the inside of the display panel. Therefore, the display panel has a longer service life.

The display substrate may be a flexible OLED display substrate or others. When the display substrate is a flexible OLED display substrate, the package structure provided according to the embodiment of the disclosure can be used to package the light-emitting layer of the flexible OLED display panel. The packaged flexible OLED display Panel has a better packaging effect.

The embodiment of the disclosure further provides a display device comprising the above-mentioned display panel. The display device has the characteristics of the above display panel and has a better packaging effect.

The embodiment of the disclosure further provides a method of manufacturing the above-mentioned package structure. FIG. 11 is a flowchart showing the method of manufacturing the above-mentioned package structure provided according to the embodiment of the disclosure. The method of manufacturing the above-mentioned package structure comprises the following steps.

In step 101, an insulating layer is formed on a substrate to be packaged, and a plurality of insulating grooves arranged at intervals is formed on the insulating layer.

In step 102, a metal layer is formed on a surface of the insulating layer away from the substrate, and a plurality of metal rims arranged at intervals is formed at the edges of the metal layer, wherein some or all of the metal rims are covered by an inorganic package layer.

In step 103, the inorganic package layer is formed on a surface of the metal layer away from the insulating layer, wherein the inorganic package layer covers the metal layer and the insulating layer.

In the method of manufacturing the above-mentioned package structure according to the embodiment of the disclosure, since the metal rims and the insulating grooves are respectively arranged at the edges of the metal layer and on the insulating layer, the water oxygen erosion path formed on the inorganic package layer and at the edges of the metal layer is not only curved in the planar direction, but also has fluctuations in the vertical direction, such that the inorganic package layer exhibits diverse arrangement characteristics when growing at the edges of the metal layer, which breaks the single rule of the growth of the inorganic package layer in the prior art. Since the structure increases the water oxygen erosion resistance while increasing the length of the erosion path, it can effectively block the intrusion of the water and oxygen outside and has a better packaging effect.

Based on the above solution, since the metal rims at the edges of the metal layer can be made through different processes, forming a plurality of metal rims arranged at intervals at the edges of the metal layer may comprise: forming the metal layer with the plurality of metal rims arranged at intervals through a once-patterning process.

Forming an inorganic package layer on a surface of the metal layer away from the insulating layer may comprise: using the inorganic package layer to cover the metal layer and the insulating layer.

In addition to the above implementation, forming a plurality of metal rims arranged at intervals at the edges of the metal layer may comprise: fabricating the plurality of metal rims, and forming the plurality of metal rims as fabricated at intervals at the edges of the metal layer.

Forming the inorganic package layer on a surface of the metal layer away from the insulating layer may comprise: using the inorganic packaging layer to cover the metal layer and the insulating layer.

In an example, the insulating layer may comprise a first insulating layer and a second insulating layer, and the step of forming an insulating layer on a substrate to be packaged may comprise: forming the first insulating layer on the substrate to be packaged, and forming the second insulating layer on a surface of the first insulating layer away from the metal substrate.

The step of forming a metal layer on a surface of the insulating layer away from the substrate may comprise: forming the metal layer on a surface of the second insulating layer away from the first insulating layer.

The step of forming a plurality of insulating grooves arranged at intervals on the insulating layer may comprise: forming the plurality of insulating grooves arranged at intervals on the second insulating layer, wherein the insulating grooves run through the second insulating layer.

The disclosure provides a package structure, a display panel, a display device and a manufacturing method thereof. In the package structure provided by the disclosure, based on the arrangements of a plurality of metal rims and a plurality of insulating grooves, the inorganic package layer exhibits diverse arrangement characteristics when growing at the edges of the metal layer, which breaks the single rule of the growth of the inorganic package layer in the prior art. Since the arrangement of the metal rims and the insulating grooves increases the water oxygen intrusion resistance and the length of the intrusion path, it can effectively block the intrusion of the water and oxygen outside towards the display panel, improve the packaging effect of the display panel and prolong the service life of the display panel.

The embodiments in the description are described in a progressive manner, and each embodiment focuses on the differences from other embodiments, and the same or similar parts between the embodiments can refer to each other.

The package structure, the display panel, the display device and the manufacturing method thereof provided by the disclosure are introduced in detail above. The specific examples herein are used to set forth the principle and implementations of the disclosure, and the above embodiments are merely used to facilitate the understanding of the method and basic ideas of the disclosure. Moreover, those skilled in the art would modify the implementations and the scope of application, according to the ideas of the present disclosure. In summary, the contents of this specification should not be construed as limiting the disclosure.

What is claimed is:

1. A package structure comprising:
    an insulating layer formed on a substrate to be packaged;
    a metal layer formed on a surface of the insulating layer away from the substrate; and
    an inorganic package layer covering the metal layer and the insulating layer; wherein a portion of the insulating layer in contact with edges of the metal layer is formed with a plurality of insulating grooves arranged at intervals, the edges of the metal layer are formed with a plurality of metal rims arranged at intervals, and some or all of the metal rims are covered by the inorganic package layer; and wherein, the plurality of metal rims are arranged in the same layer as the metal layer, orthographic projections of the plurality of metal rims on the insulating layer correspond, on a one-to-one basis, to the plurality of insulating grooves, and an orthographic projection of each of the metal rims on the insulating layer partially overlaps a groove opening of a corresponding insulating groove.

2. The package structure according to claim 1, wherein the plurality of insulating grooves arranged at intervals are periodically arranged in the portion of the insulating layer in contact with the edges of the metal layer, the plurality of metal rims arranged at intervals are periodically formed in the portion of the edges of the metal layer that is covered by the inorganic package layer, and the plurality of insulating grooves are arranged with a same periodic interval as the plurality of metal rims.

3. The package structure according to claim 1, wherein the insulating layer comprises a first insulating layer formed on the substrate to be packaged, and a second insulating layer formed on the first insulating layer, wherein the metal layer is formed on a surface of the second insulating layer away from the first insulating layer, the insulating grooves are arranged on the second insulating layer, and the insulating grooves run through the second insulating layer.

4. The package structure according to claim 1, wherein a half of the orthographic projection of each of the metal rims on the insulating layer overlaps a groove opening of the corresponding insulating groove.

5. The package structure according to claim 1, wherein, the substrate is a display substrate, a depth of the corresponding insulating groove is greater than twice of a thickness of the metal layer and is less than a pixel size.

6. The package structure according to claim 5, wherein a contour of each of the metal rims is square, rectangle, circle, oval, parallelogram or trapezoid; and a shape of the groove opening of the corresponding insulating groove is square, rectangle, circle, oval, parallelogram or trapezoid.

7. The package structure according to claim 1, wherein, the substrate is a display substrate, a contour of each of the metal rims is an arc, and each of the metal rims has a radius greater than twice of a thickness of the metal layer and less than a pixel size.

8. The package structure according to claim 1, wherein a shape of the groove opening of the corresponding insulating groove is the same as or different from a contour of a corresponding metal rim.

9. A display panel comprising the package structure according to claim 1, wherein the insulating layer of the package structure is formed on a display substrate of the display panel.

10. The display panel according to claim 9, wherein the display substrate is a flexible OLED display substrate.

11. The display panel according to claim 9, wherein the plurality of insulating grooves arranged at intervals are periodically arranged in the portion of the insulating layer in contact with the edges of the metal layer, the plurality of metal rims arranged at intervals are periodically formed in the portion of the edges of the metal layer that is covered by the inorganic package layer, and the plurality of insulating grooves are arranged with a same periodic interval as the plurality of metal rims.

12. The display panel according to claim 9, wherein the insulating layer comprises a first insulating layer formed on the substrate to be packaged, and a second insulating layer formed on the first insulating layer, wherein the metal layer is formed on a surface of the second insulating layer away from the first insulating layer, the insulating grooves are arranged on the second insulating layer, and the insulating grooves run through the second insulating layer.

13. A method of manufacturing a package structure, comprising:
    forming an insulating layer on a substrate to be packaged, and forming a plurality of insulating grooves arranged at intervals on the insulating layer;
    forming a metal layer on a surface of the insulating layer away from the substrate, and forming a plurality of metal rims arranged at intervals at edges of the metal layer, wherein some or all of the metal rims are covered by an inorganic package layer;
    forming the inorganic package layer on a surface of the metal layer away from the insulating layer, wherein the inorganic package layer covers the metal layer and the insulating layer.

14. The method according to claim 13, wherein forming the plurality of metal rims arranged at intervals at edges of the metal layer comprises: forming the metal layer with the plurality of metal rims arranged at intervals through a once-patterning process; and
    forming the inorganic package layer on the surface of the metal layer away from the insulating layer comprises: using the inorganic package layer to cover the metal layer and the insulating layer.

15. The method according to claim 13, wherein forming the plurality of metal rims arranged at intervals at the edges of the metal layer comprises: fabricating the plurality of metal rims and forming the plurality of metal rims as fabricated at intervals at the edges of the metal layer; and
    forming the inorganic package layer on the surface of the metal layer away from the insulating layer comprises: using the inorganic package layer to cover the metal layer and the insulating layer.

16. The method according to claim 13, wherein the insulating layer comprises a first insulating layer and a second insulating layer, and forming the insulating layer on the substrate to be packaged comprises: forming the first insulating layer on the substrate to be packaged, and forming the second insulating layer on a surface of the first insulating layer away from the substrate;

forming the metal layer on the surface of the insulating layer away from the substrate comprises: forming the metal layer on a surface of the second insulating layer away from the first insulating layer; and forming the plurality of insulating grooves arranged at intervals on the insulating layer comprises: forming the plurality of insulating grooves arranged at intervals on the second insulating layer, wherein the insulating grooves run through the second insulating layer.

17. The method according to claim 13, wherein a half of an orthographic projection of each of the metal rims on the insulating layer overlaps a groove opening of the corresponding insulating groove.

18. The method according to claim 13, wherein the substrate is a display substrate, a depth of the corresponding insulating groove is greater than twice of a thickness of the metal layer and is less than a pixel size.

19. The method according to claim 13, wherein the substrate is a display substrate, a contour of the each of the metal rims is an arc, and each of the metal rims has a radius greater than twice of a thickness of the metal layer and less than a pixel size.

20. The method according to claim 13, wherein a shape of the groove opening of the corresponding insulating groove is same as or different from a contour of a corresponding metal rim.

* * * * *